United States Patent [19]

Kitakata

[11] Patent Number: 4,642,672
[45] Date of Patent: Feb. 10, 1987

[54] SEMICONDUCTOR DEVICE HAVING REGISTRATION MARK FOR ELECTRON BEAM EXPOSURE

[75] Inventor: Makoto Kitakata, Tokyo, Japan
[73] Assignee: NEC Corporation, Tokyo, Japan
[21] Appl. No.: 531,569
[22] Filed: Sep. 13, 1983
[30] Foreign Application Priority Data
Sep. 14, 1982 [JP] Japan .............................. 57-160060
[51] Int. Cl.[4] ...................... H01L 49/02; H01L 21/66
[52] U.S. Cl. ..................................... 357/40; 357/85;
357/45; 357/68; 357/71; 324/158 T; 427/43.1;
430/22
[58] Field of Search ................ 324/158 T; 357/68, 71,
357/40, 45, 85; 430/22; 427/43.1

[56] References Cited
U.S. PATENT DOCUMENTS

| | | | |
|---|---|---|---|
| 3,445,727 | 5/1969 | Maple | 357/71 |
| 3,480,412 | 11/1969 | Duffek et al. | 357/71 |
| 4,323,638 | 4/1982 | Adams et al. | 427/43.1 |
| 4,356,223 | 10/1982 | Iida et al. | 430/22 |
| 4,407,933 | 10/1983 | Fraser et al. | 430/22 |
| 4,467,400 | 8/1984 | Stopper | 357/45 |

FOREIGN PATENT DOCUMENTS 2543651 4/1976 Fed. Rep. of Germany ........ 357/68
57-106056 7/1982 Japan ..................................... 357/68

OTHER PUBLICATIONS

Conf. IEDM, Wash. D.C., 7–9 Dec. 1981, "Observation of ... GaAs", Milano et al, pp. 626–628.

Primary Examiner—Andrew J. James
Assistant Examiner—Jerome Jackson, Jr.
Attorney, Agent, or Firm—Sughrue, Mion, Zinn, Macpeak & Seas

[57] ABSTRACT

This invention relates to a structure of a registration mark for electron beam exposure technique. The mark comprises a lower metal film formed on a semiconductor substrate such as GaAs substrate having high electrical resistivity, and a upper metal film formed on the lower metal film and having a raised or indented crisscross shape. A connecting portion is connected electrically to the lower metal film and extends on the substrate. According to this structure, charge that has been built up in the registration mark by many scanning actions can be discharged through the connecting portion and hence, accurate registration is possible.

9 Claims, 13 Drawing Figures

SEMICONDUCTOR DEVICE HAVING REGISTRATION MARK FOR ELECTRON BEAM EXPOSURE

BACKGROUND OF THE INVENTION

This invention relates to a structure of a registration mark for electron beam exposure and more particularly, to a semiconductor device such as a gallium arsenide device or the like having a registration mark for electron beam exposure.

When an electron beam is radiated to a registration mark and a neighborhood thereof which is provided on an object such as GaAs semiconductor substrate having high resistivity in order to make registration, build-up of charge occurs on this registration mark, and therefore, the mark position can not be accurately detected by the stored charge in the mark.

In electron beam exposure techniques for forming microfine pattern in the fabrication of semiconductor devices or the like, the amount of the dosage of electron beam into a resist for electron beam exposure is determined by the resist sensitivity. In detecting the registration mark, on the other hand, detection is carried out by detecting scattered electrons with respect to the incident electron beam upon the registration mark. In other words, the change in the scattered electrons (reflected electrons, secondary electrons), that occurs when the electron beam is scanned from the flat portion to step portion of the registration mark, is detected by a scintillator detector or the like so as to confirm the position of the registration mark. In this case, scanning of the electron beam on the registration mark is carried out repeatedly in order to obtain high detection accuracy, that is, to detect the mark position with a high level of accuracy, and to obtain a high S/N ratio. Therefore, the amount of dosage of the electron beam to be radiated to the mark becomes higher level than that of the electron beam to be applied to the resist to form the device regions.

When the registration mark is disposed on a semiconductor substrate having high resistivity such as GaAs, therefore, the charge is built up at this mark and the scanning direction of the incident electrons is modulated by the charged electrons in the mark so that the detection position accuracy of the registration mark is adversely affected.

The operation for detecting the registration mark is essentially effected as a pre-operation for forming an etching pattern, and therefore, the position of the registration mark must be accurately detected. Namely, above mentioned charged electrons in the registration mark on the substrate having high resistivity must be effectively rejected so that the incident electron beam is not modulated by the charged electrons. For rejecting and preventing the charged electrons, in the prior art, the impurity region of high impurity concentration is formed in the substrate under the registration mark by ion injection techniques. However, thermal annealing treatment is necessary for forming the impurity region after ion injection and such a thermal treatment changes sensitively the characteristics of the device region. Moreover, such a impurity region cannot disperse the charged electrons effectively. Furthermore, the techniques can not be applied if the substrate consists of a dielectric other than the semiconductor, such as glass, for example.

SUMMARY OF THE INVENTION

It is an object of the present invention to provide a registration mark structure by which accurate detection of the mark is realized.

It is another object of the present invention to provide a semiconductor device having effective registration mark in which charge is not accumulated.

It is still another object of the present invention to provide a semiconductor wafer having effective registration marks by which the incident electron beam is not modulated defectively.

It is a further object of the present invention to provide an insulating substrate having effective registration marks which can be used for the accurate calibration of different electron beam exposure apparatuses.

According to the one feature of the present invention, there is provided a semiconductor device comprising a semiconductor substrate, a registration mark for electron beam exposure provided at a peripheral portion of the semiconductor substrate other than a device region, and a connecting portion connected electrically to the registration mark, extending on the substrate and reaching a peripheral edge of the semiconductor substrate, the registration mark including a lower metal film deposited on one major surface of the semiconductor substrate and an upper metal film on the lower metal film and having a raised or indented pattern.

According to another feature of the present invention, there is provided a semiconductor wafer comprising a semiconductor substrate, a plurality of semiconductor elements formed in a center portion of the substrate and arranged in a matrix form, a metal film layer surrounding each semiconductor element so as to form a grid-like shape, a registration mark provided on the semiconductor wafer at a peripheral portion thereof, and a connecting portion connecting the registration mark to a part of the metal film layer, the registration mark including a lower metal film deposited on one major surface the semiconductor wafer and an upper metal film on the lower metal film and having a raised or indented shape. The wafer may comprise a contact region formed on the major surface of the semiconductor wafer and connecting electrically a part of the metal film layer or the registration mark.

According to still another feature of the present invention, there is provided an object to be exposed to electron beam comprising an insulating substrate, a metal film disposed on a peripheral portion of a main surface of the substrate, a plurality of registration marks for electron beam exposure disposed on the main surface of the substrate, and a plurality of connecting portions each connecting portion connecting each registration mark to the metal film, each of the registration marks including a lower metal film connected to the connecting portion and deposited on the main surface of the substrate and an upper metal film disposed on the lower metal film and having formed thereon a mark pattern.

According to further another feature of the present invention, there is provided a registration mark for electron beam exposure comprising a lower metal film disposed on a region on a major surface of a substrate to be exposed to electron beam exposure inside a region including an electron beam scanning region, an upper metal film disposed on the lower metal film to form a registration mark shape, and an electrically conductive connecting portion disposed on the major surface of the substrate so as to be connected to the lower metal film and to extend on the major surface of the substrate.

The lower metal film, the connecting portion and the metal film surrounding each element in the wafer state are continuously formed by evaporation of gold, and the upper metal film is favorably formed by gold plating, and the raised or indented shape pattern is of crisscross plan view.

Generally, the semiconductor substrate is a semi-insulating substrate such as gallium arsenide (GaAs).

In accordance with the present invention, the lower metal film is disposed below the upper metal film in which the registration mark pattern is formed, and the connecting portion is connected to the lower metal film and extends on the substrate. Therefore, charge is not stored in the mark, and accurate detection of the mark is realized.

DESCRIPTION OF THE PREFERRED EMBODIMENTS

Figure 1:
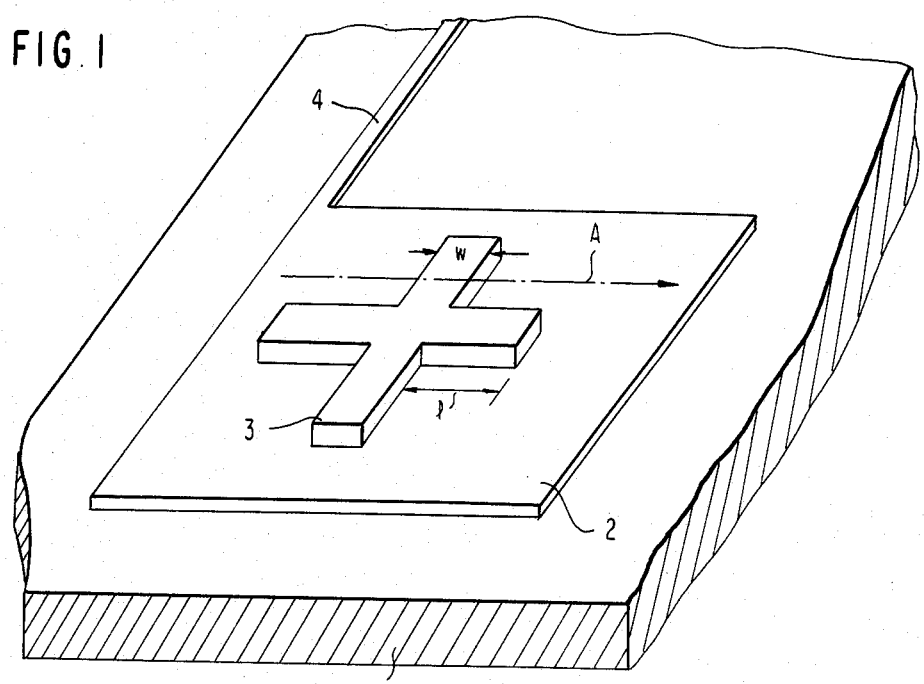
FIG. 1 is a perspective view showing a registration mark structure in accordance with one embodiment of the present invention.

FIG. 1 is a schematic partial perspective view showing only the portions around a registration mark in accordance with one embodiment of the present invention. An lower gold film 2 of 100 to 1000 Å thickness is deposited by evaporation on a high resistivity GaAs substrate 1 having resistivity of $10^7$ Ohm-cm, for example, so as to include a registration work range, and an upper gold film 3 is formed on the lower film. The upper gold film 3 has the 1,000 to 5,000 Å thickness and a crisscross protuberance form. This gold plating film 3 is 2 to 50 μm width (w) and 10 to 200 μm length (l) on each side. A connecting portion 4 is formed so as to secure electric conduction with other registration work ranges. This connecting portion 4 is formed simultaneously with the lower deposited film 2 and is at least 1 μm width.

In order to scan the electron beam within the range of the lower film 2 and to effectively obtain a registration detection signal corresponding to the upper film 3 when carrying out this registration work, it is advisable that the connection portion 4 of the lower deposited film is outside the registration work range and has a thinly elongated belt-like form in comparison with the registration range in order to increase the device area.

Figure 2:
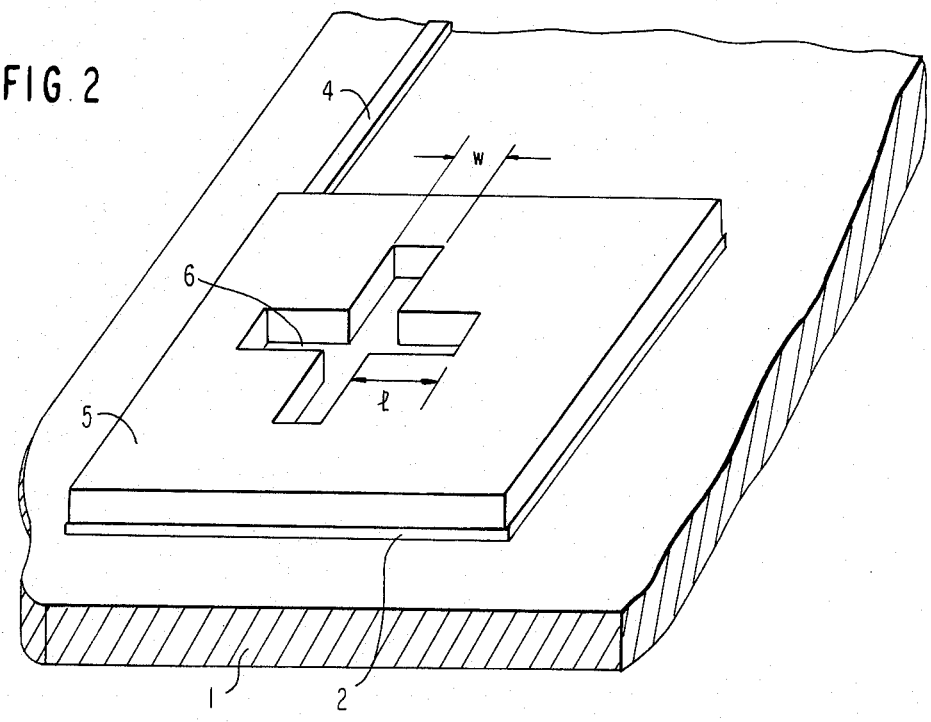
FIG. 2 is a perspective view showing the registration mark structure in accordance with another embodiment of the present invention.

FIG. 2 shows the registration mark in accordance with another embodiment of the present invention, in which like reference numerals are used to identify like constituents. A crisscross recessed mark 6 is formed by etching inside a plating film 5 which is analogous to the plating film 3 of FIG. 1 and is formed on the region of the lower deposited film 2. Even if the exposed area of the lower film 2 on the substrate 1 is smaller than the upper film 5, the registration work is possible from the change of detection signals from them and hence, a further complicated shape may be employed.

Hereinafter, a method of forming the registration mark shown in FIG. 1 will be described.

Figure 3A:
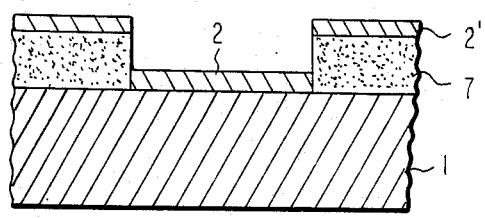
FIGS. 3A through 3C are cross-sectional views showing the method of forming the registration mark in accordance with the embodiment of the present invention.

A first resist 7 is disposed on a high resistivity substrate 1 such as GaAs and an aperture pattern is formed on it in a size including the registration work range. Evaporation films 2, 2' such as gold are deposited over the entire surface (FIG. 3A). Next, the evaporation film 2' on the first resist 7 is removed by lift-off to form a lower deposited film 2. In this case, the connecting portion 4 of FIG. 1 is also formed.

Figure 3B:
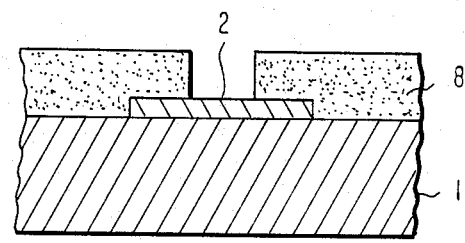

Thereafter, a patterned resist 8 is disposed to form a plating film, as shown in FIG. 3(b).

Figure 3C:
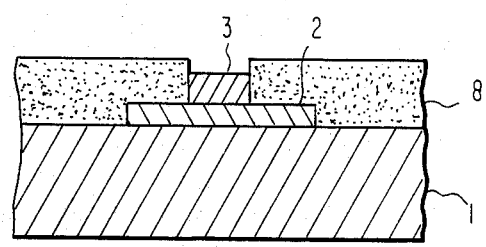

Next, as shown in FIG. 3(c), a registation mark upper film 3 is formed by gold plating. The heavy metal such as gold provides higher scrattering strength of electron beam than that of aluminum. Therefore, the heavy metal is favorable for the registration mark of electron beam exposure.

Since the lower film provides the conduction in the registration mark in the present invention, repeated scanning of the registration work can be carried out effectively without any adverse influences by the build-up of charge and the charge is effectively prevented from being accumulated, because it is drained through the connecting portion. When the registration mark upper film is formed by plating using a heavy metal, practically high detection signal intensity can be obtained and hence, an extremely excellent result can be obtained as the registration operation.

Figure 4:
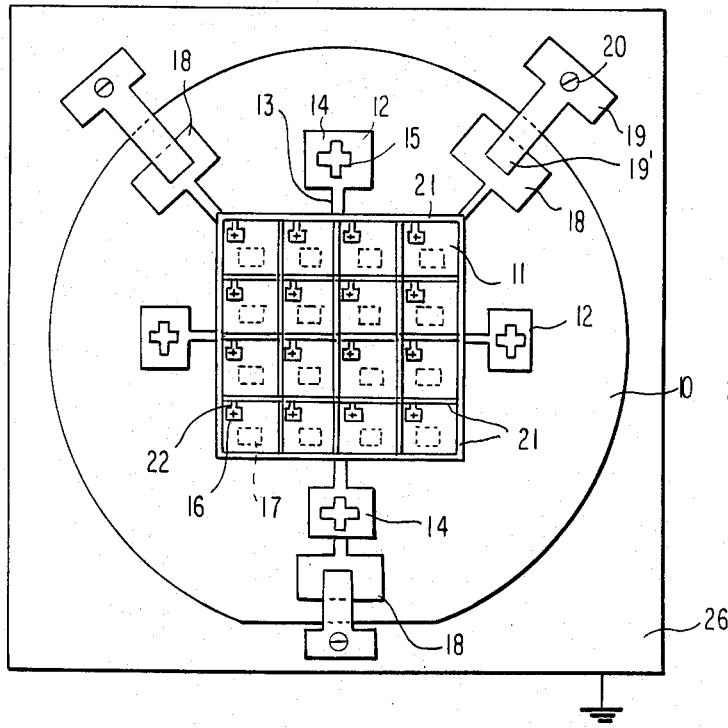
FIG. 4 is a plan view showing the state in which the registration mark of the present invention is disposed on each of a semiconductor wafer and a plurality of semiconductor elements.

FIG. 4 shows the cases where the registration marks of the present invention are provided on a semiconductor wafer and semiconductor elements, that is, semiconductor devices, respectively.

A plurality of semiconductor elements, that is, semiconductor devices 11, are formed in the matrix arrangement on a high resistivity substrate 10 such as GaAs. Four registration marks 12 for the wafer are provided at the positions where the semiconductor elements 11 are not formed. Each registration mark 12 for wafer consists of a primer metal film that is lower film 14, a raised or indented crisscross upper metal film 15 and a connecting portion 13.

Figure 5:
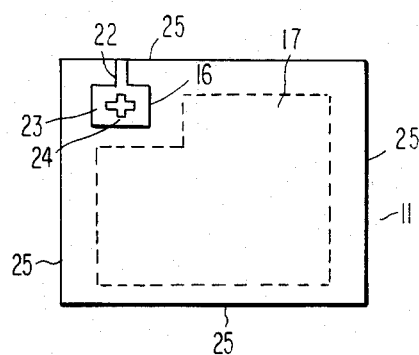
FIG. 5 is a plan view showing a semiconductor device having the registration marks in accordance with the present invention.

On the other hand, the registration mark 16 is formed around the peripheral portion of each semiconductor element 11 except its device region 17. As shown in FIG. 5, this chip registration mark 16 consists of a lower metal film 23 and a raised or indented upper metal film 24 and a connecting portion 22 connecting it to the lower film. Returning to FIG. 4, an about a 5 μm width metal wire layer 21 is simultaneously formed in the grid-like form with the lower metal films 14, 23 and the connecting portions 13, 22 inside a scribe region (not shown) between each of the elements 11. The connecting portion 22 of the chip registration mark 16 and the connecting portion 13 of the wafer registration mark 12 are connected to this metal wiring layer 21 in each portion. However, the metal wiring layer 21 that is formed in the grid form is removed when the wafer is scribed along the scribe region after each process is completed, thereby separating into chips, that is, into individual semiconductor devices. Accordingly, the connecting portion 22 inside each semiconductor device (semiconductor chip) 11 ends up at the peripheral end 25 of the chip.

On the other hand, contact regions 18 consisting of a metal film are formed on this semiconductor wafer 10. Of these contact regions 18, two are connected to the metal wiring layer 21 in the grid form and the other one is connected to the lower metal film 12 of the wafer registration mark 14.

To expose this semiconductor wafer 10 to the electron beam, the wafer 10 is first placed on a metal sheet 26 and supports 19 made of beryllium copper or the like are fixed to metal sheet 26 by screws 20. One of the ends 19' of each support 19 is brought into contact with each of the three contact regions 18. The metal sheet 26 is then grounded or it may be biased to a positive potential.

According to the arrangement described above, the charge that has been built up at the registration marks 16 of the elements 11 can be easily discharged through the connecting portion 22, the metal wire layer 21, the contact region 18, the support 19 and the metal sheet 26. Similarly, the charge that has been built up at the registration marks 12 of the wafer 10 can be discharged through the metal wire layer 21 or directly through the contact region 18, and then through the support 19 and the metal sheet 26.

In an electron beam exposure apparatus having repeated position detection accuracy of up to $3\sigma = \pm 0.2$ $\mu$m ($\sigma$: standard deviation), gold is evaporated in a thickness of 500 Å as a lower metal film directly on a high resistivity GaAs substrate (resistivity of 10 Ohm-cm) and a connecting portion is connected to the lower film. A registration mark of upper gold plating film having $l = 25$ $\mu$m, $w = 5$ $\mu$m (in FIG. 1) and thickness of 2,000 Å and the shape such as shown in FIG. 1 is tested. Repeated scanning is carried out 50 times with a scanning length of 50 $\mu$m in the direction represented by A in FIG. 1 at a beam current of 20 nA and a scanning speed of 0.25 con/sec. As a result, an extremely excellent result of the deviation of $3\sigma = \pm 0.2$ $\mu$m can be obtained. In contrast, when the similar test is carried out by directly depositing a crisscross gold plating layer on the high resistivity GaAs substrate and then removing the lower metal film deviation as large as $3\sigma = \pm 0.5$ to 0.8 $\mu$m occurs under the same condition.

As described above, since the present invention secures the conduction by the lower metal film and the connecting portion connected to the former, it is effective to obtain high registration accuracy.

Next, an example of the fabrication of a semi-conductor device using the registration marks of the present invention will be described briefly.

Figure 6A:
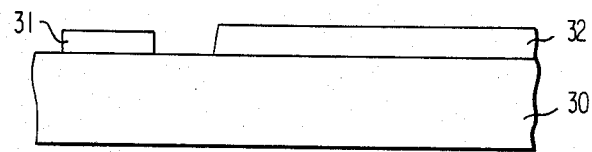
FIGS. 6A through 6E are cross-sectional views showing step-wise the method of fabricating a semiconductor device using the registration mark in accordance with the present invention.
Figure 6B:
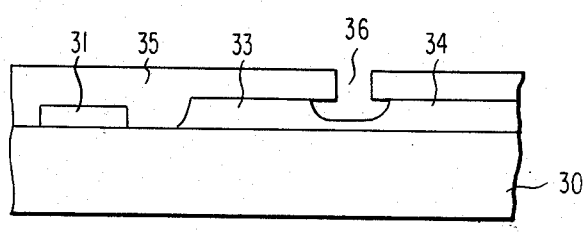
Figure 6C:
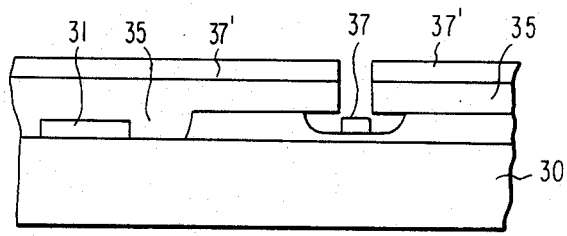
Figure 6D:
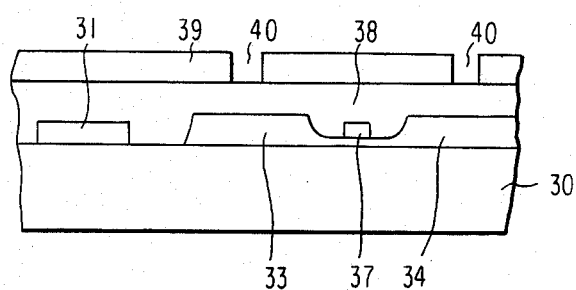
Figure 6E:
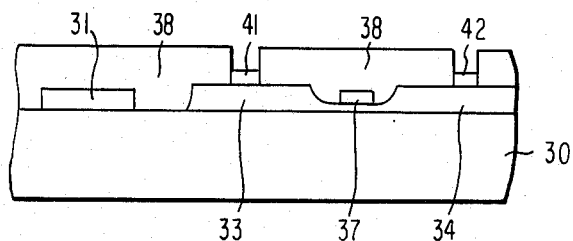

The registration mark 31 of the present invention is disposed at the portion of a high resistivity GaAs substrate 30 except the device region, and a GaAs semiconductor layer 32 containing an N-type impurity is formed in the device region (FIG. 6A). Next, a first electron resist 35 is deposited and after registration is made by use of the registration mark 31, exposure is made and an aperture is then opened in the resist in a customary manner. The semiconductor layer 32 is etched as shown in FIG. 6B in a predetermined pattern and formed source and drain regions 33, 34. Next, aluminum is evaporated over the entire surface (FIG. 6C) and the resist 35 and aluminum 37' thereon are removed by lift-off, thereby forming a first electrode (gate electrode) 37 of aluminum on the thin semiconductor layer. Next, a silicon dioxide film 38 is deposited by a CVD process and a second electron resist 39 is disposed on the film 38. After registration is again made using the registration marks 31, the electron beam is selectively radiated to the resist 39 for etching to form two windows 40 (FIG. 6D).

Openings are formed in the silicon dioxide film 38 under the windows 40, and source and drain electrodes 41, 42 of aluminum are formed in the openings in the same way the gate electrode 37 is formed.

Figure 7:
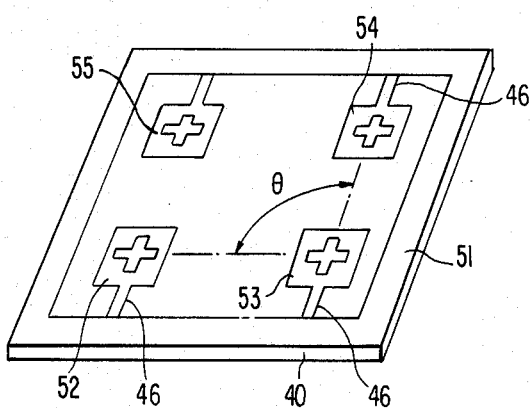
FIG. 7 is a perspective view showing the state in which the registration marks of the present invention are disposed on an insulating substrate.

FIG. 7 shows an example in which the present invention is employed for the calibration of different electron beam exposure apparatuses.

A metal film 51 is formed on peripheral portions of a glass substrate 51 and the registration marks 52, 53, 54 and 55 are disposed on the substrate and connected through each connecting portion 46 to the metal film 51. The metal film 51 is grounded. The angle $\theta$ on the glass mark and the distance between each mark of the different apparatuses are measured to obtain calibration data of the different apparatuses.

The coefficient of thermal expansion of the substrate can be measured by forming the substrate in the construction shown in FIG. 7 using a dielectric such as ceramic, glass or plastic and heating the substrate to a predetermined temperature so as to measure the distance between the registration marks.

What is claimed is:

1. A semiconductor device comprising a semiconductor substrate having a rectangular shape in the plan view surrounded by four straight edge lines, a device region to form device elements therein positioned at a major space of said semiconductor substrate, a registration mark for electron beam exposure provided on a peripheral portion of said semiconductor substrate other than said device region, and a connecting portion connected electrically to said registration mark, extending on said semiconductor substrate from said registration mark toward a part of one of said straight edge lines without entering into any part of said device region and reaching said part of said one of said straight edge lines, said registration mark and said device region being free from any means for connecting electrically therebetween, and said registration mark including a lower metal film deposited on one major surface of said semiconductor substrate and an upper metal film on said lower metal film having a raised or indented pattern.

2. A semiconductor device of claim 1, in which said connecting portion is connected to said lower metal film of said registration mark.

3. A semiconductor device of claim 1, in which said lower and upper metal films are made of gold.

4. The semiconductor device of claim 1, in which said semiconductor substrate is a semi-insulating substrate.

5. The semiconductor device of claim 4, in which said semi-insulating substrate is a gallium arsenide substrate.

6. The semiconductor device of claim 1, in which said raised or indented pattern is of a crisscross shape.

7. A semiconductor wafer comprising a semiconductor substrate, a plurality of semiconductor elements formed in a center portion of said substrate and arranged in a matrix form, a metal film layer surrounding each said semiconductor element so as to form a grid-like shape, a registration mark provided on said semiconductor wafer at a peripheral portion thereof, and a connecting portion connecting said registration mark to a part of said metal film layer, each of said semiconductor elements having a device region to form device elements therein positioned at a major space of said element, said registration mark not being coupled electrically to any of said device regions of respective said semiconductor elements, and said registration mark including a lower metal film deposited on one major surface of said semiconductor wafer and an upper metal film on said lower metal film and having a a raised or indented shape.

8. A semiconductor wafer of claim 7 further comprising a contact region formed on said major surface of said semiconductor wafer and connecting electrically a part of said metal film layer or said registration mark.

9. An object to be exposed to an electron beam comprising an insulating substrate having a rectangular shape in the plan view surrounded by four straight edge lines, a metal film disposed on a peripheral portion of the main surface of said substrate such that it surround the center portion of said main surface of said substrate, four registration marks for electron exposure disposed on said main surface of said substrate in the vicinity of respective four corners of said substrate but separated from said metal film, and four connecting portions, each said connecting portion connecting each said registration mark to the nearest part of said metal film, each of said registration marks including a lower metal film connected to said connecting portion and deposited on said main surface of said substrate and an upper metal film disposed on said lower metal film and having a mark pattern thereon.

* * * * *

UNITED STATES PATENT AND TRADEMARK OFFICE
CERTIFICATE OF CORRECTION

PATENT NO. : 4,642,672
DATED : February 10, 1987
INVENTOR(S) : Makoto Kitakata

It is certified that error appears in the above-identified patent and that said Letters Patent is hereby corrected as shown below:

Column 5, line 38, "10" should read -- $10^7$ --.

Column 7, line 13, delete "a" (second occurrence).

Signed and Sealed this

Twenty-second Day of December, 1987

Attest:

DONALD J. QUIGG

*Attesting Officer*  *Commissioner of Patents and Trademarks*